United States Patent
Kwon et al.

(10) Patent No.: US 10,665,814 B2
(45) Date of Patent: May 26, 2020

(54) DISPLAY DEVICE WITH SLIDABLE COVER

(71) Applicant: LG ELECTRONICS INC., Seoul (KR)

(72) Inventors: Seokho Kwon, Seoul (KR); Brian Chung, Seoul (KR); Youngsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/537,856

(22) PCT Filed: Aug. 5, 2015

(86) PCT No.: PCT/KR2015/008200
§ 371 (c)(1),
(2) Date: Jun. 19, 2017

(87) PCT Pub. No.: WO2016/098989
PCT Pub. Date: Jun. 23, 2016

(65) Prior Publication Data
US 2017/0352831 A1    Dec. 7, 2017

(30) Foreign Application Priority Data

Dec. 19, 2014  (KR) .................. 10-2014-0184972
Dec. 29, 2014  (KR) .................. 10-2014-0192694

(51) Int. Cl.
*H01L 51/50*     (2006.01)
*H01L 51/52*     (2006.01)
(Continued)

(52) U.S. Cl.
CPC ........ *H01L 51/5237* (2013.01); *G06F 1/1601* (2013.01); *H01L 51/56* (2013.01);
(Continued)

(58) Field of Classification Search
CPC ... G06F 1/1601; G02F 1/1333; H05K 5/0017; H05K 5/03; H01L 51/5237; H01L 51/56
See application file for complete search history.

(56) References Cited

U.S. PATENT DOCUMENTS 9,568,757 B2 *   2/2017   Lee ................... G02F 1/133308
2002/0135294 A1 * 9/2002   Fujishiro ........... G02F 1/133308
                                                            313/493
(Continued)

FOREIGN PATENT DOCUMENTS

CN       101625815       1/2010
CN       102867461       1/2013
(Continued)

OTHER PUBLICATIONS

PCT International Application No. PCT/KR2015/008200, International Search Report dated Apr. 22, 2016, 3 pages.

(Continued)

*Primary Examiner* — Daniel P Wicklund
*Assistant Examiner* — Douglas R Burtner
(74) *Attorney, Agent, or Firm* — Lee, Hong, Degerman, Kang & Waimey PC

(57) ABSTRACT

A display device is disclosed. The display device of present invention may comprise a display panel; a module cover coupled with the display panel, the module cover positioned at a rear of the display panel; a rear cover slidably coupled to the module cover, the rear cover positioned at a rear of the module cover; a mold portion coupled with one of the module cover and the rear cover; and a coupling portion coupled with another of the module cover and the rear cover, the coupling portion corresponding to the mold portion, wherein the mold portion is slidably coupled to the coupling portion.

13 Claims, 24 Drawing Sheets

(51) Int. Cl.
*H01L 51/56* (2006.01)
*G06F 1/16* (2006.01)
*H05K 5/00* (2006.01)
*H05K 5/03* (2006.01)

(52) U.S. Cl.
CPC ............. *H05K 5/0017* (2013.01); *H05K 5/03* (2013.01); *G06F 2200/1612* (2013.01)

(56) References Cited

U.S. PATENT DOCUMENTS

| | | | | |
|---|---|---|---|---|
| 2006/0207434 | A1* | 9/2006 | Takeda | G06F 1/1601 99/342 |
| 2007/0115401 | A1* | 5/2007 | Tsubokura | G02F 1/1333 349/58 |
| 2008/0060244 | A1* | 3/2008 | Yang | G06F 1/1601 40/716 |
| 2008/0130212 | A1* | 6/2008 | Jeong | H04N 5/645 361/679.01 |
| 2008/0151138 | A1* | 6/2008 | Tanaka | G02F 1/133308 349/58 |
| 2013/0010415 | A1* | 1/2013 | Hatta | G02F 1/133308 361/679.01 |
| 2013/0128544 | A1* | 5/2013 | Kuo | H04N 13/30 362/97.1 |
| 2013/0149482 | A1* | 6/2013 | Kuo | G02F 1/1333 428/58 |
| 2013/0194781 | A1* | 8/2013 | Kim | H04M 1/0266 362/97.1 |
| 2013/0279181 | A1* | 10/2013 | Kawachi | H01L 51/5237 362/372 |
| 2014/0362325 | A1* | 12/2014 | Lee | G02F 1/133308 349/58 |
| 2015/0351261 | A1* | 12/2015 | Lee | G02F 1/1333 361/679.01 |
| 2016/0353587 | A1* | 12/2016 | Shin | G06F 1/1601 |
| 2017/0227808 | A1* | 8/2017 | Lee | G02F 1/133308 |
| 2017/0299913 | A1* | 10/2017 | Choi | G02F 1/133308 |

FOREIGN PATENT DOCUMENTS

| | | |
|---|---|---|
| CN | 202841761 | 3/2013 |
| CN | 103177665 | 6/2013 |
| CN | 103226917 | 7/2013 |
| CN | 103413501 | 11/2013 |
| JP | 2005070662 | 3/2005 |
| KR | 1020080114449 | 12/2008 |
| KR | 1020100113196 | 10/2010 |
| KR | 1020110019501 | 2/2011 |
| KR | 1020110019502 | 2/2011 |
| WO | 2009002103 | 12/2008 |

OTHER PUBLICATIONS

European Patent Office Application Serial No. 15870157.3, Search Report dated Aug. 3, 2018, 7 pages.
State Intellectual Property Office of the People's Republic of China Application Serial No. 201580068819.4, Office Action dated Jan. 28, 2019, 10 pages.
The State Intellectual Property Office of the People's Republic of China Application Serial No. 201580068819.4, Office Action dated Feb. 6, 2020, 7 pages.

* cited by examiner

FIG. 11
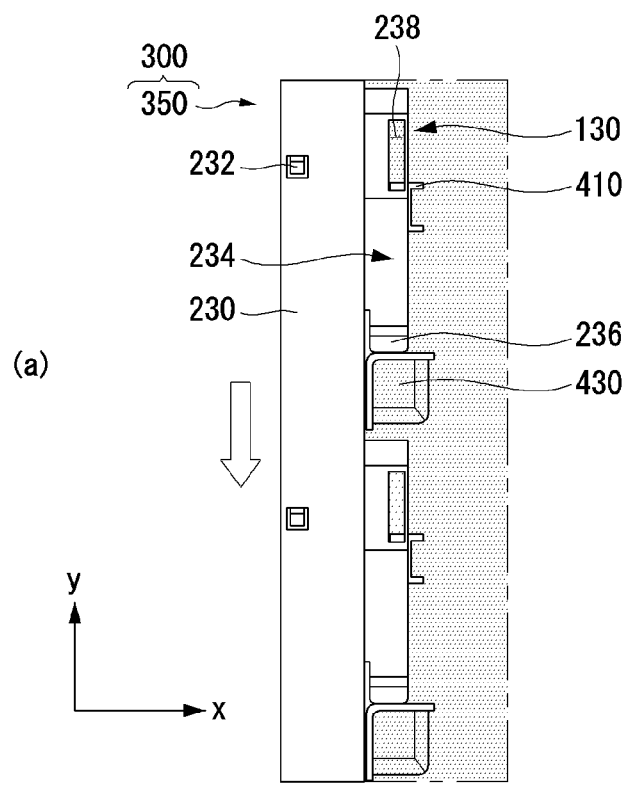
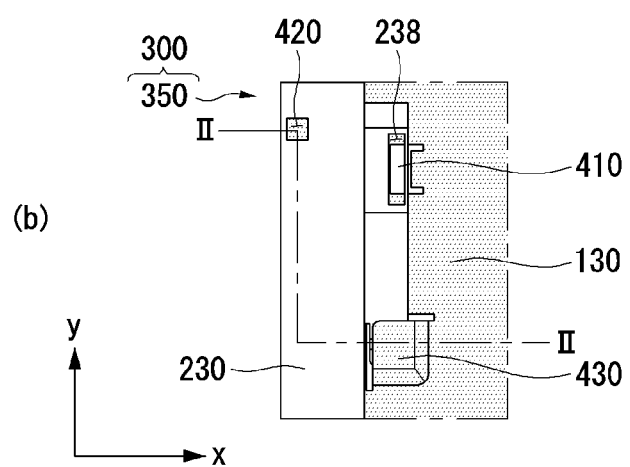

DISPLAY DEVICE WITH SLIDABLE COVER

CROSS-REFERENCE TO RELATED APPLICATIONS

This application is the National Stage filing under 35 U.S.C. 371 of International Application No. PCT/KR2015/008200, filed on Aug. 5, 2015, and also claims the benefit of earlier filing date and right of priority to Korean Patent Application Nos. 10-2014-0184972 filed on Dec. 19, 2014 and 10-2014-0192694 filed on Dec. 29, 2014, the contents of which are all hereby incorporated by reference herein in their entirety.

TECHNICAL FIELD

The present invention relates to a display device of which rear cover capable of being slidably coupled easily.

BACKGROUND ART

As the information society develops, the demand for display devices is increasing in various forms. In recent years, various display devices such as a liquid crystal display device (LCD), a plasma display panel (PDP), an electro luminescent display (ELD), and a vacuum fluorescent display (VFD) have been studied and used.

Among these, a display device using an organic light emitting diode (OLED) has an advantage of being excellent in luminance characteristics and viewing angle characteristics compared to a liquid crystal display device, and very thin owing to lack of a backlight unit.

DISCLOSURE

Technical Problem

The present invention is directed to solving the above-mentioned problems and other problems. Another object of the present invention is to provide a display device of which rear cover capable of being slidably coupled easily.

Technical Solution

In one aspect, there is provided a display device comprising: a display panel; a module cover coupled with the display panel, the module cover positioned at a rear of the display panel; a rear cover slidably coupled to the module cover, the rear cover positioned at a rear of the module cover; a mold portion coupled with one of the module cover and the rear cover; and a coupling portion coupled with another of the module cover and the rear cover, the coupling portion corresponding to the mold portion. the mold portion may be slidably coupled to the coupling portion.

According to another aspect of the present disclosure, the coupling portion may be located on at least one long edge of the module cover, and the coupling portion may include an opening open in a sliding direction of the rear cover.

According to another aspect of the present disclosure, the coupling portion may include: a first coupling portion positioned at a periphery of the module cover; and a second coupling portion positioned inner than the first coupling portion.

According to another aspect of the present disclosure, the mold portion may comprise: a third coupling portion corresponding to the first coupling portion; and a fourth coupling portion corresponding to the second coupling portion, at least one of the first to fourth coupling portions may be elastically deformed, and a deformation of the third and fourth coupling portions may be greater than a deformation of the first and second coupling portions.

According to another aspect of the present disclosure, the coupling portion may be located on at least one short edge of the module cover, and the coupling portion may include an opening open in a sliding direction of the rear cover.

According to another aspect of the present disclosure, the coupling portion may include: a sixth coupling portion positioned at a periphery of the module cover; a fifth coupling portion positioned inner than the sixth coupling portion; and a seventh coupling portion positioned inner than the sixth coupling portion.

According to another aspect of the present disclosure, the mold portion may comprise: a eighth coupling portion corresponding to the fifth coupling portion; a ninth coupling portion corresponding to the sixth coupling portion; and a tenth coupling portion corresponding to the seventh coupling portion, the fifth coupling portion may be a mold, and the eighth coupling portion may be elastically deformed and contact with the fifth coupling portion.

According to another aspect of the present disclosure, the fifth coupling portion may include: a body portion; and a seating portion extended from the body portion, the eighth coupling portion may be seated at the seating portion of the fifth coupling portion, and a height of the body portion may be greater than a height of the seating portion.

According to another aspect of the present disclosure, the display device may further comprise a plate positioned between the display panel and the module cover, and the plate may be coupled with at least one of the display panel and the module cover.

According to another aspect of the present disclosure, the display panel may be an OLED (organic light emitting diodes) type.

Advantageous Effects

Effects of the display device according to the present invention will be described as follows.

According to at least one of the embodiments of the present invention, there is an advantage that the rear cover is capable of being coupled slidably easily.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will become apparent to those skilled in the art.

BRIEF DESCRIPTION OF THE DRAWINGS

FIGS. 3 to 13 are views showing the configuration of the display device of FIG. 2.

MODE FOR INVENTION

Figure 1:
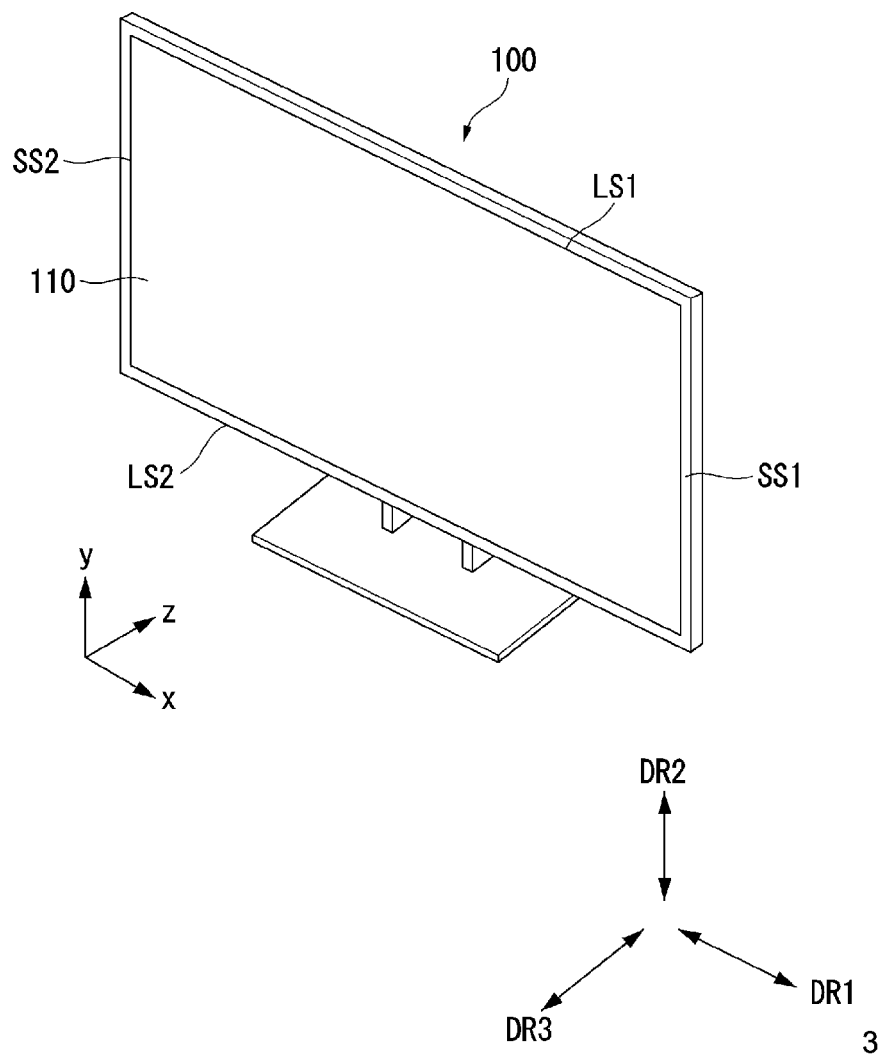
FIG. 1 is a view illustrating a display device according to an embodiment of the present invention.

Hereinafter, a display device according to the present invention will be described in detail with reference to the accompanying drawings.

Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, the embodiments of the invention are described using a liquid crystal display panel as an example of a display panel. Other display panels may be used. For example, a plasma display panel (PDP), a field emission display (FED) panel, and an organic light emitting diode (OLED) display panel may be used.

Referring to FIG. 1, a display device 100 may include a first long side LS1, a second long side LS2 opposite the first long side LS1, a first short side SS1 adjacent to the first long side LS1 and the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device 100, and a second direction DR2 may be a direction parallel to the short sides SS1 and SS2 of the display device 100.

Further, a third direction DR3 may be a direction vertical to the first direction DR1 and/or the second direction DR2.

In the embodiment disclosed herein, the first direction DR1 and the second direction DR2 may be commonly referred to as a horizontal direction.

Further, the third direction DR3 may be referred to as a vertical direction.

The display device 100 may be of the OLED type. By using the display panel 110 which emits light by itself, the display device 100 may have relatively thin thickness.

Figure 2:
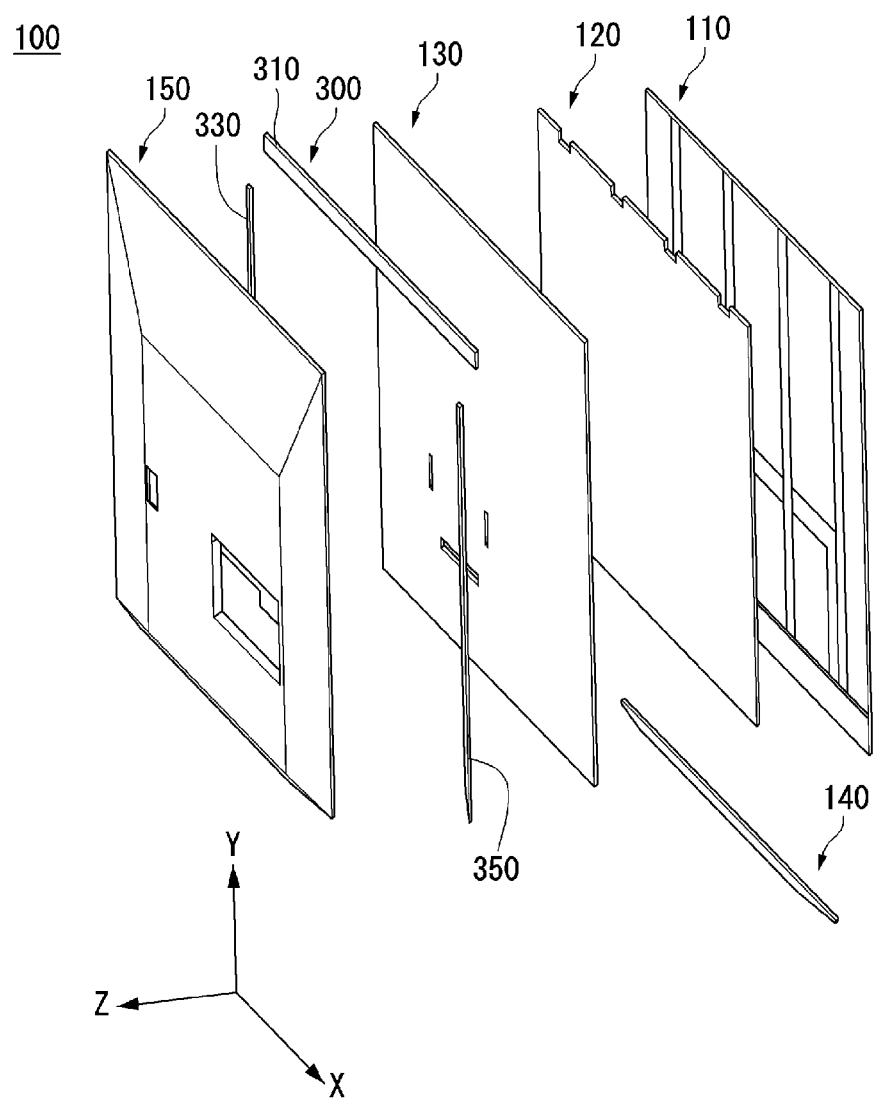
FIG. 2 is an exploded view of the display device of FIG. 1.

FIG. 2 is an exploded view of the display device of FIG. 1.

The display device 100 according to an embodiment of the present invention may include a display panel 110, a plate 120, a module cover 130, a rear cover 150, a bottom cover 140, and a mold portion 300. The bottom cover 140 may be coupled with a lower long side of the display device 100.

The display panel 110 may display an image. The display panel 110 may include a plurality of layers. For example, the display panel 100 may include a front substrate, a back substrate, and/or an optical layer.

The display panel 110 may be an organic light emitting diode (OLED) panel that emits light by itself. In the case of an OLED panel, an auxiliary illumination for displaying an image may not be necessary. The display device 100 may be implemented with a relatively thin thickness, and may be capable of being curved.

A plate 120 may be attached to a rear surface of the display panel 110. The plate 120 and the display panel 110 and/or the module cover 130 may be joined together by an adhesive tape. For example, the display panel 110 may be attached to an front side of the plate 120, and the plate 120 may be attached to an front side of the module cover 130.

The plate 120 and the display panel 110 and/or the module cover 130 may be coupled by a magnetic force. For example, at least one of the plate 120, the display panel 110, and/or the module cover 130 may be magnetic and be attached to another. Disassembly/recombination of the plate 120, the display panel 110, and/or the module cover 130 may be facilitated in case of magnetic attachment.

The plate 120 may be made of aluminum. The plate 120 may disperse heat transmitted to the display panel 110. Accordingly, heat concentration of the specific area of the display panel 110 is prevented, and deformation of the display panel 110 may be prevented.

The module cover 130 may be attached to the plate 120. The module cover 130 and the plate 120 may be joined together by an adhesive tape or the like. The module cover 150 may be provided with a forming area. The forming region may serve to disperse and/or diffuse heat generated in an electronic circuit or the like.

The rear cover 150 may be connected to the display panel 110 in a sliding manner in a direction from the first long side LS1 toward the second long side LS2, that is, in the second direction DR2. In other words, the rear cover 150 may be connected between the first short side SS1 of the display module 110 and the second short side SS2 against the first short side SS1.

In order to slideably connect the rear cover 150 to the display panel 110, the rear cover 150 and/or other structures adjacent thereto may include protrusions, sliding portions, engaging portions, and the like.

The mold portion 300 may be coupled to the rear cover 150 and/or the module cover 130. The mold portion 300 may be formed of a plastic material. The mold portion 300 may include first to third molds 310 to 330. The first mold 310 may be attached to the long side, and the second and third molds 330 and 350 may be attached to the short side. The mold portion 300 may be attached to the inner surface of the rear cover 150.

FIGS. 3 to 13 are views showing the configuration of the display device of FIG. 2.

The display device 100 according to an embodiment of the present invention may easily and accurately slide and connect the rear cover 150 using the mold portion 300.

The mold portion 300 may be attached to the rear cover 150. For example, the first to third molds 310, 330, and 350 may be coupled to the inner edge of the rear cover 150.

The module cover 130 may be provided with a configuration corresponding to the mold portion 300. A structure having a certain shape may be provided in a region adjacent to the upper long side of the module cover 130 and a region adjacent to the left and right short sides. For example, the corresponding area of the module cover 130 may be press-processed.

Figure 4:
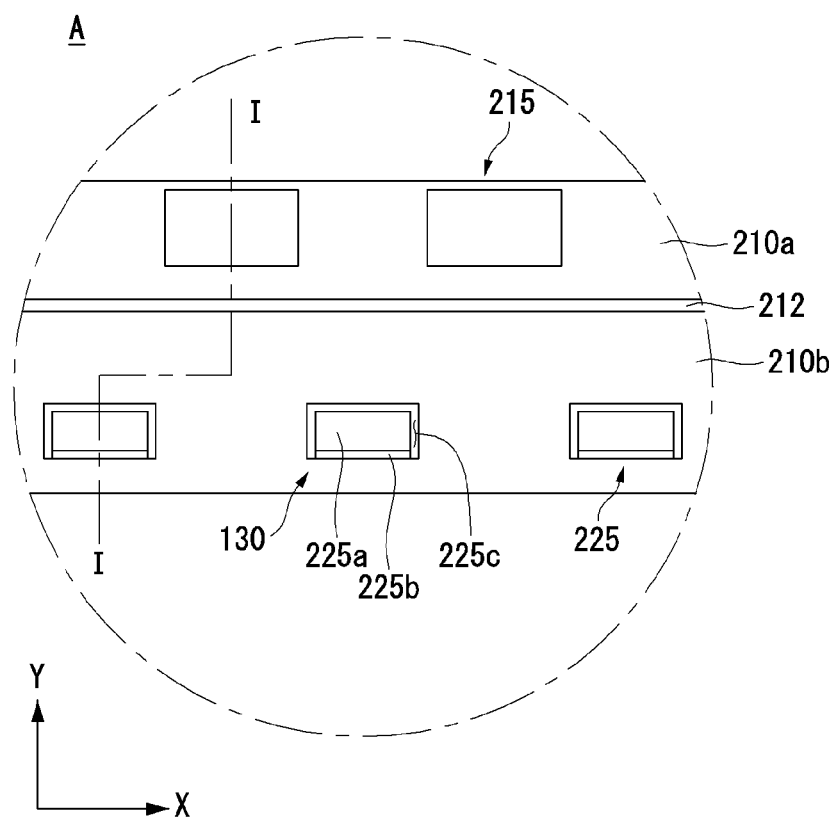

FIG. 4 is a plan view of the module cover 130 at the A region. The first and second coupling portions 215 and 225 may be provided on the A region of the module cover 130 of the display device 100 according to an embodiment of the present invention. A coupling portion may stand for at least one of the first coupling portion 215 and the second coupling portion 225.

The first and second coupling portions 215 and 225 may be formed along the upper long side of the module cover 130. The first and second coupling portions 215 and 225 may be repeatedly formed along the edge area.

The first and second coupling portions 215 and 225 may have an opening formed in the sliding direction of the rear cover 150. For example, an opening may be formed to correspond to a direction from the upper side to the lower side of the display device 100, so that it can be combined with the structure inside the rear cover 150 to be slid.

The first and second coupling portions 215 and 225 may be formed by pressing the corresponding region of the module cover 130. For example, the first and second coupling portions 215 and 225 may be formed by pressing or removing a part of the plate-shaped module cover 130.

The first coupling portion 215 may be formed in the first region 210a of the edge. The first region 210a may be a region that protrudes upward from the second region 210b. For example, the height of the first and second regions 210a and 210b may be changed stepwise through the boundary area 212.

The second coupling portion 225 may be formed in the second area 210b of the edge. The second coupling portion 225 may be located in the inner area than the first area 210a which is the outermost peripheral area. The second coupling portion 225 may include a body portion 225a, a boundary portion 225b, and a slit 225c.

The first coupling portion 215 and the second coupling portion 225 may be arranged in a zigzag form. That is, the first coupling portion 215 and the second coupling portion 225 may be arranged so as not to overlap with each other in the Y direction.

Figure 5:
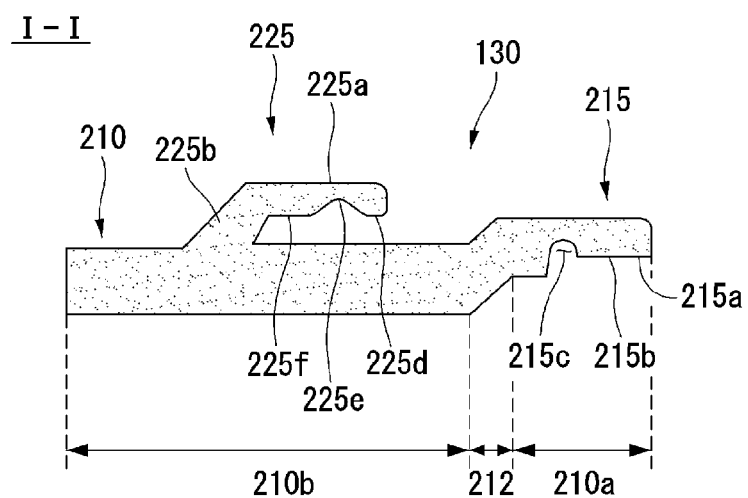

FIG. 5 is a cross-sectional view of the A region taken along the line I-I in the FIG. 4. The first coupling portion 215 may have different height from that of the second coupling portion 212 due to the boundary area 212. For example, the second coupling portion 225 may have a shape protruding in the Z direction as compared with the first coupling portion 215.

The first coupling portion 215 may include an end portion 215a, a body portion 215b, and a groove portion 215c. The groove portion 215c may be an area in which a part of the body portion 215b is recessed inwardly. Due to the shape of the groove portion 215c, the counterpart coupled to the first coupling portion 215 may be securely coupled to the first coupling portion 215.

The second coupling portion 225 may include an end portion 225d, a groove portion 224e, and a body 225f. The body 225f may extend from the module cover 130 via the boundary portion 225b. The second coupling portion 225 may protrude backward with respect to the first coupling portion 215. The second coupling portion 225 may be positioned on a plane different from a plane on which the first coupling portion 215.

Figure 6:
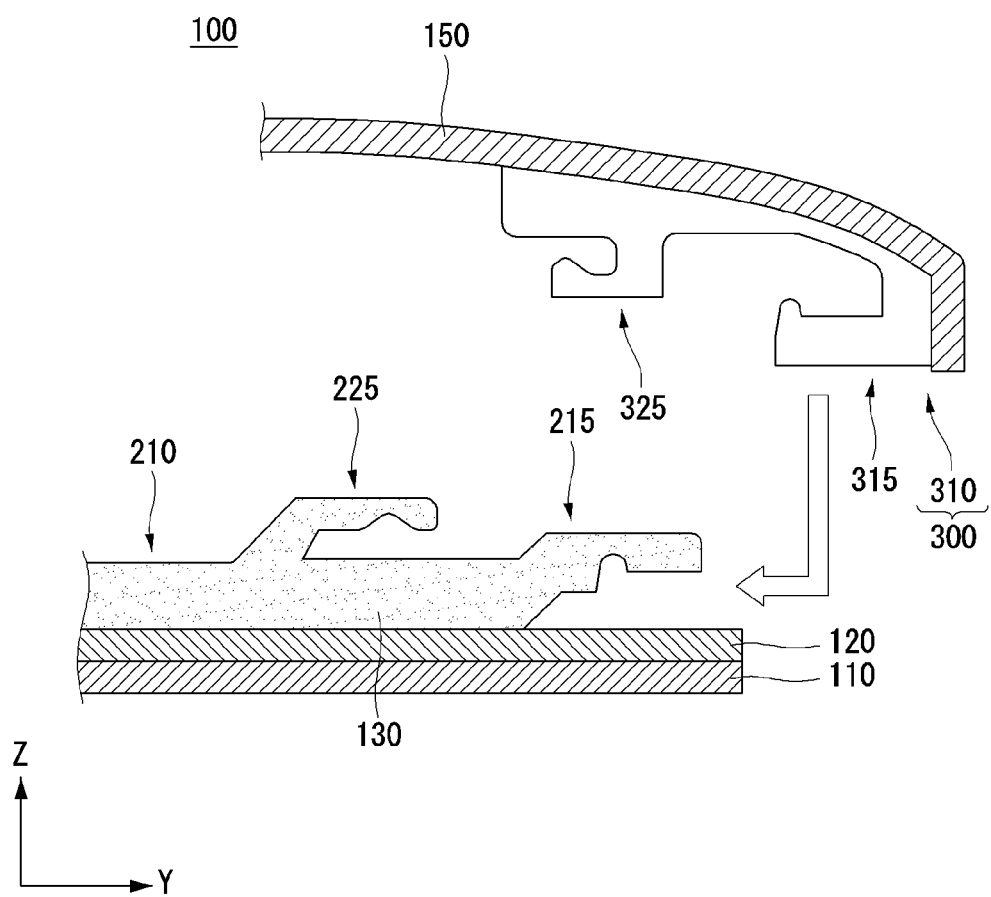
Figure 7:
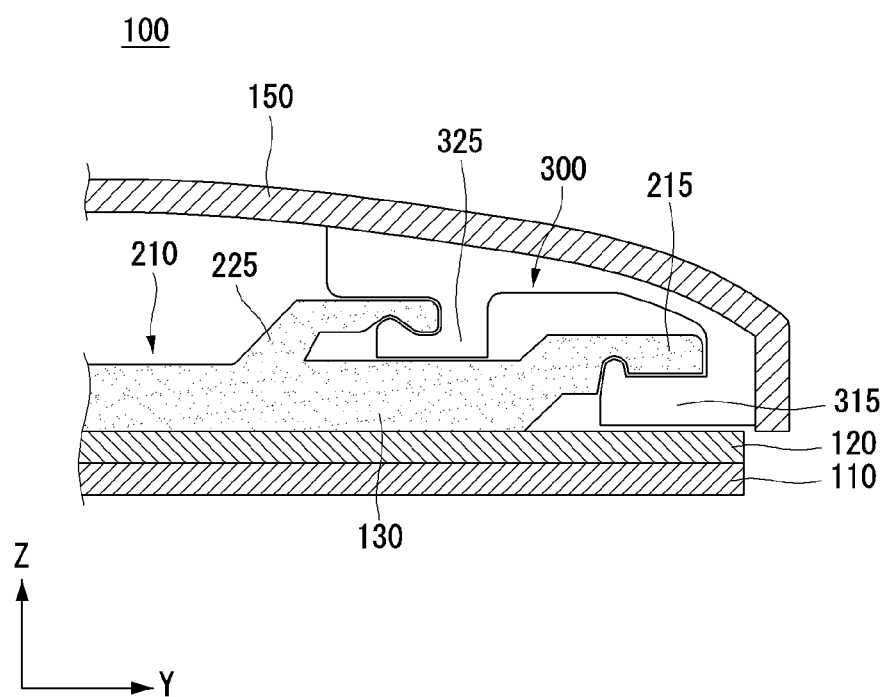

FIGS. 6 and 7 are views showing a process of coupling the first and second coupling portions 215 and 225 with the first mold 310.

Referring to FIG. 6, the third and fourth coupling portions 315 and 325 of the first mold 310 may be slidably coupled with the first and second coupling portions 215 and 225. The third coupling portion 315 of the first mold 310 coupled to the upper long side inside the rear cover 150 may be coupled with the first coupling portion 215. The fourth coupling portion 325 may be coupled with the second coupling portion 225. An edge area 210 may be an edge portion of the module cover 130. The edge area 210 may be referred to as the coupling portion 210.

Referring to FIG. 7, the rear cover 150 may be slidably coupled with the module cover 130. The shapes of the first and second coupling portions 215 and 225 may correspond to the shapes of the third and fourth coupling portions 315 and 225.

Figure 8:
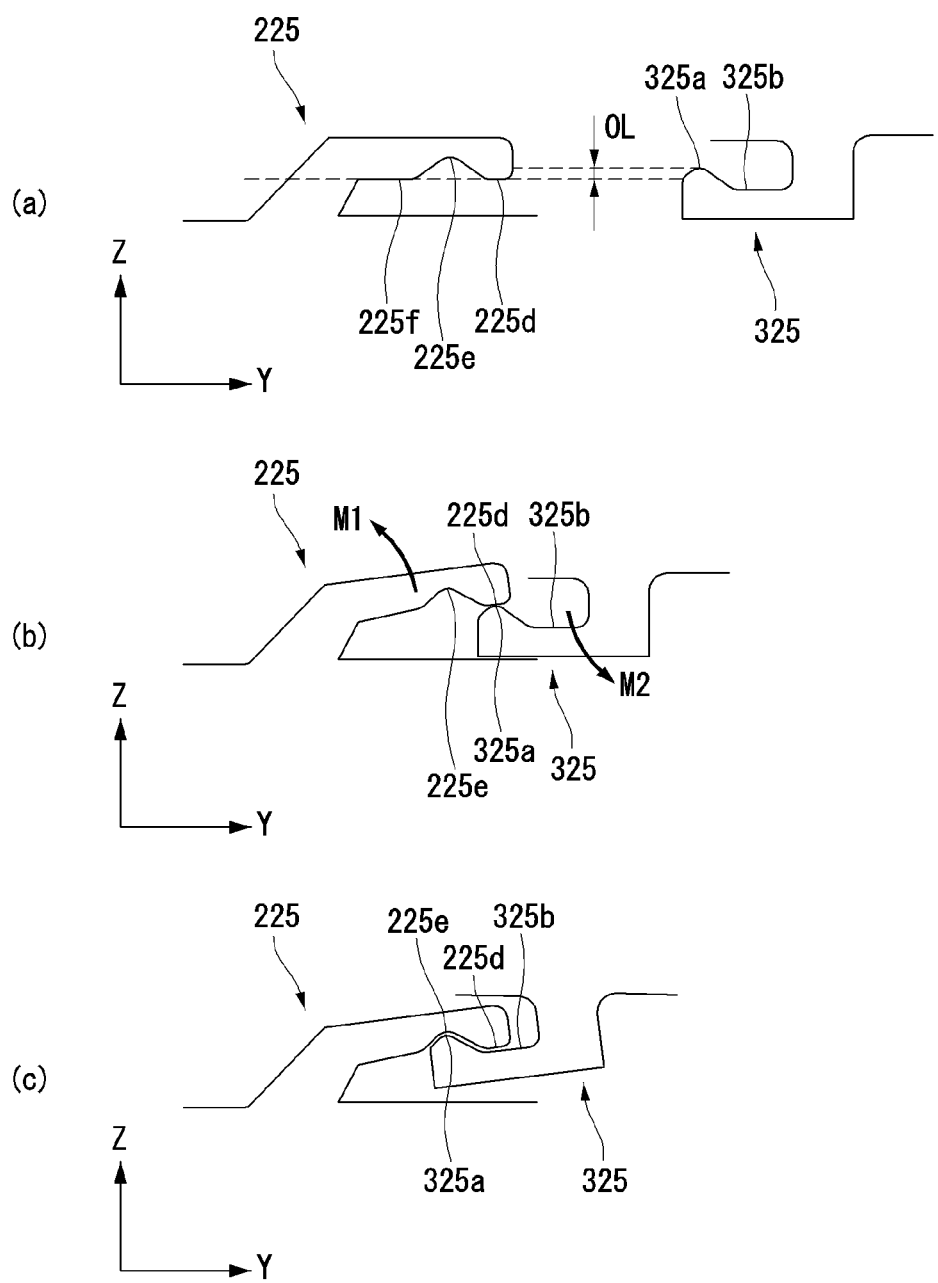

Referring to FIG. 8, the first and second coupling portions 215 and 225 at the module cover 130 and the third and fourth coupling portions 315 and 325 at the rear cover 150 may be coupled by being deformed within a certain extent.

Referring to FIG. 8 (a), the body 225f of the second coupling portion 225 and the body 325f of the fourth coupling portion 325 corresponding thereto may be placed to form an overlapping area OL.

Referring to FIG. 8 (b), in the coupling process between the second coupling portion 225 and the fourth coupling portion 325, the end portion 225d of the second coupling portion 225 may be in contact with the end portion 325a of the fourth coupling portion 325.

When the end portion 225d of the second coupling portion 225 and the end portion 325a of the fourth coupling portion 325 are in contact with each other, the second coupling portion 225 and/or the fourth coupling portion 325 may be deformed. For example, the second coupling portion 225 may be deformed in the first direction M1 and the fourth coupling portion 325 may be deformed in the second direction M2. At this time, in case the module cover 130 in which the second coupling portion 225 is formed is made of a metal material, the deformation in the second direction M2 occurs only. Or the deformation in the second direction M2 may be greater than that in the first direction M1.

Referring to FIG. 8 (c), the second and fourth coupling portions 225 and 325 may be maintained in a state of being deformed to a certain extent. For example, the coupling may be maintained in a state that the second and fourth coupling portions 225 and 325 are inclined with a horizontal axis.

The second and fourth coupling portions 225 and 325 are in close contact with and coupled to each other due to the overlap region OL, which leads that the second and fourth coupling portions 225 and 325 can be firmly fastened. Noise and/or vibration due to the vibration of the second and fourth coupling portions 225, 325 can be prevented.

Figure 3:
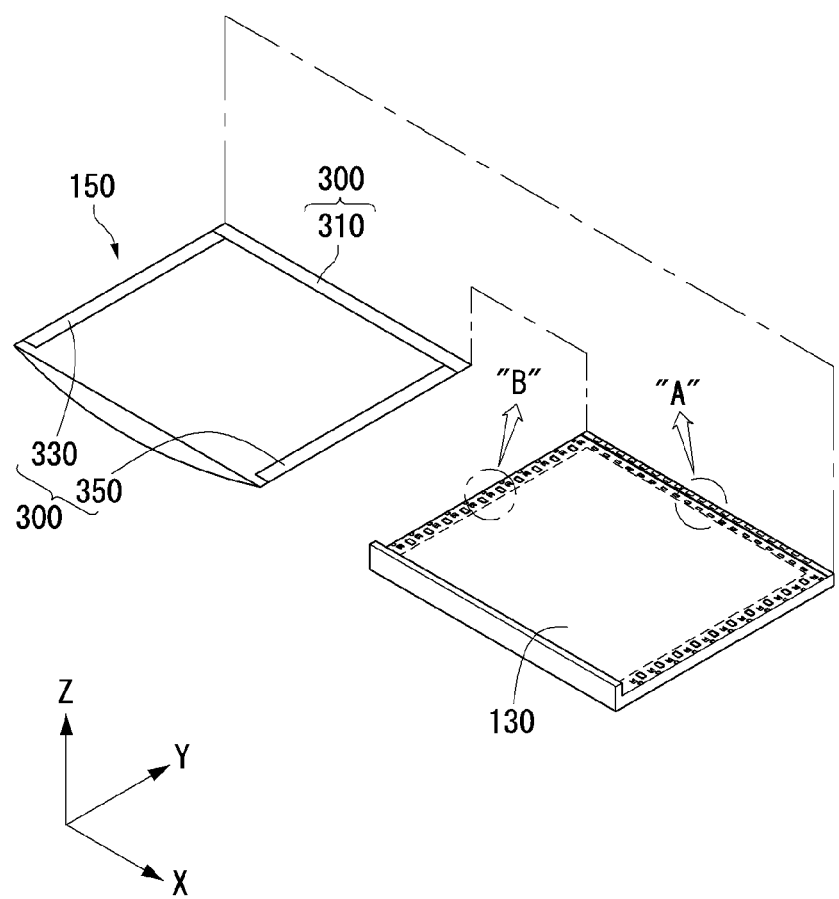
Figure 9:
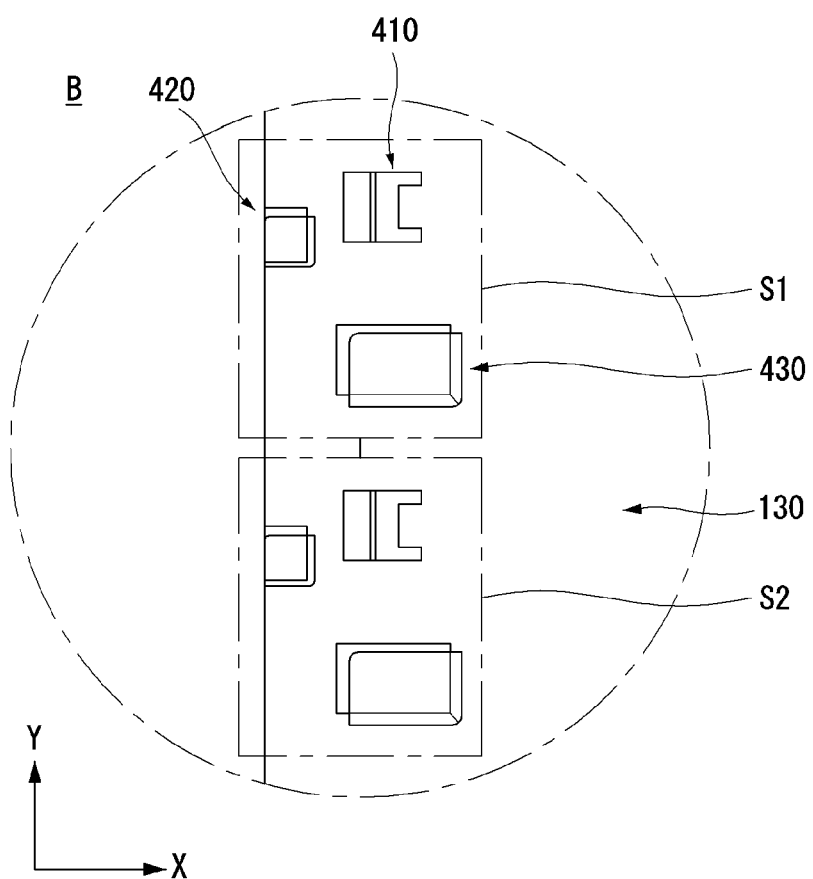

FIG. 9 is a planar view of the module cover 130 in the B region shown in FIG. 3. Fifth to seventh coupling portions 410, 420 and 430 may be formed in the B region of the module cover 130 of the display device 100 according to an embodiment of the present invention. The coupling portion may stand for at least one of the fifth to seventh coupling portions 410, 420, and 430.

The fifth to seventh coupling portions 410, 420, and 430 may have openings in the sliding direction of the rear cover 150.

The fifth to seventh coupling portions 410, 420, and 430 may be repeatedly formed along the long side of the module cover 130. For example, a first set S1 may include the fifth to seventh coupling portions 410, 420, 430. For example, a second set S2 may include the fifth to seventh coupling portions 410, 420, 430. The second set S2 may be located beside the first set S1.

The fifth to seventh coupling portions 410, 420 and 430 may be coupled with the mold portion 300 of the rear cover 150 when the rear cover 150 is coupled in sliding manner.

Figure 10:
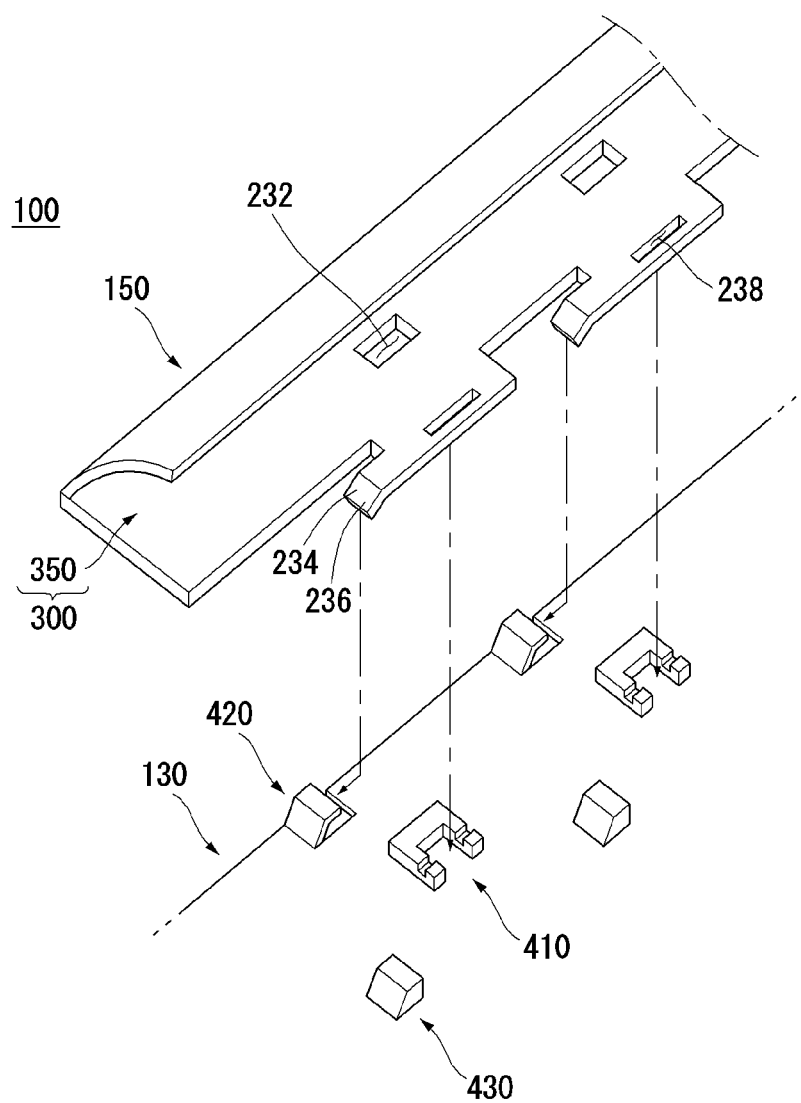

FIG. 10 is a perspective view showing a coupling relationship between the module cover 130 and the rear cover 150. For convenience of understanding, the rear cover 150 is expressed transparent or translucent. The mold portion 300 may be attached to the inside of the rear cover 150. For example, a third mold 350 coupled to the long side may be located.

The mold portion 300 may be provided with the eighth to tenth coupling portions 238, 232, and 234. The eighth to tenth coupling portions 238, 232 and 234 of the rear cover 150 may correspond to the fifth to seventh coupling portions 410, 420 and 430 of the module cover 130. The eighth to tenth coupling portions 238, 232, and 234 may be slidably coupled with the fifth to seventh coupling portions 410, 420, and 430.

The eighth coupling portion 238 may be a slit formed in a part of the mold portion 300. The mold portion 300 may be in the form of penetrating. The eighth coupling portion 238 may correspond to the fifth coupling portion 410. The coupling relationship between the eighth coupling portion 238 and the fifth coupling portion 410 will be described later.

The ninth coupling portion 232 may be a sliding coupling structure formed in a part of the mold portion 300. For example, the ninth coupling portion 232 may be a latch which corresponds to the shape of the protruded sixth coupling portion 420.

The tenth coupling portion 234 may be configured such that at least a part of the mold portion 300 protrudes to correspond to the seventh coupling portion 430. The tenth coupling portion 234 may be formed with an inclined portion 236 for smooth sliding engagement with the seventh coupling portion 430. The inclined portion 236 may be inclined in the Y and Z directions.

The ninth and tenth engaging portions 232 and 234 may be located at flange portions protruding outward from the mold portion 300. The fifth and seventh engaging portions 410 and 430 may be located inside the sixth engaging portion 420 located at the outermost edge area of the module cover 130. The ninth and tenth engaging portions 232 and 234 may be located on a flange protruding in the X direction which is inner side in the body of the mold unit 300.

FIG. 11 illustrates sliding engagement (coupling) of the mold portion 300. The mold portion 300 may be slid in the Y direction.

Referring to FIG. 11 (a), the mold portion 300 may be in the first state. In the first state, the eighth to tenth coupling portions 238, 232 and 234 of the mold portion 300 may be not coupled with the fifth to seventh coupling portions 410, 420 and 430 of the module cover 130.

Referring to FIG. 11 (b), when the mold portion 300 is slid in the Y direction, the eighth to tenth coupling portions 238, 232, and 234 may be inserted into the fifth to seventh coupling portions 410 420, and 430, respectively.

Figure 12:
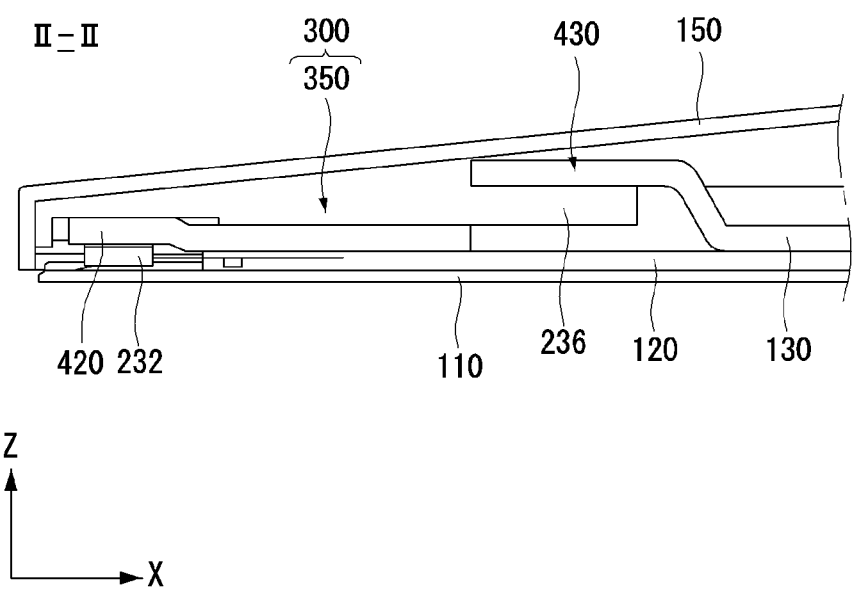

FIG. 12 is a cross-sectional view taken along the line II-II of FIG. 11 (b). The eighth to tenth coupling portions 238, 232, and 234 may be coupled with the fifth to seventh coupling portions 410, 420, and 430 in the second state. The ninth coupling portion 232 and the inclined portion 236 of the tenth coupling portion 234 can be inserted below the sixth and seventh coupling portions 420 and 430, respectively.

Figure 13:
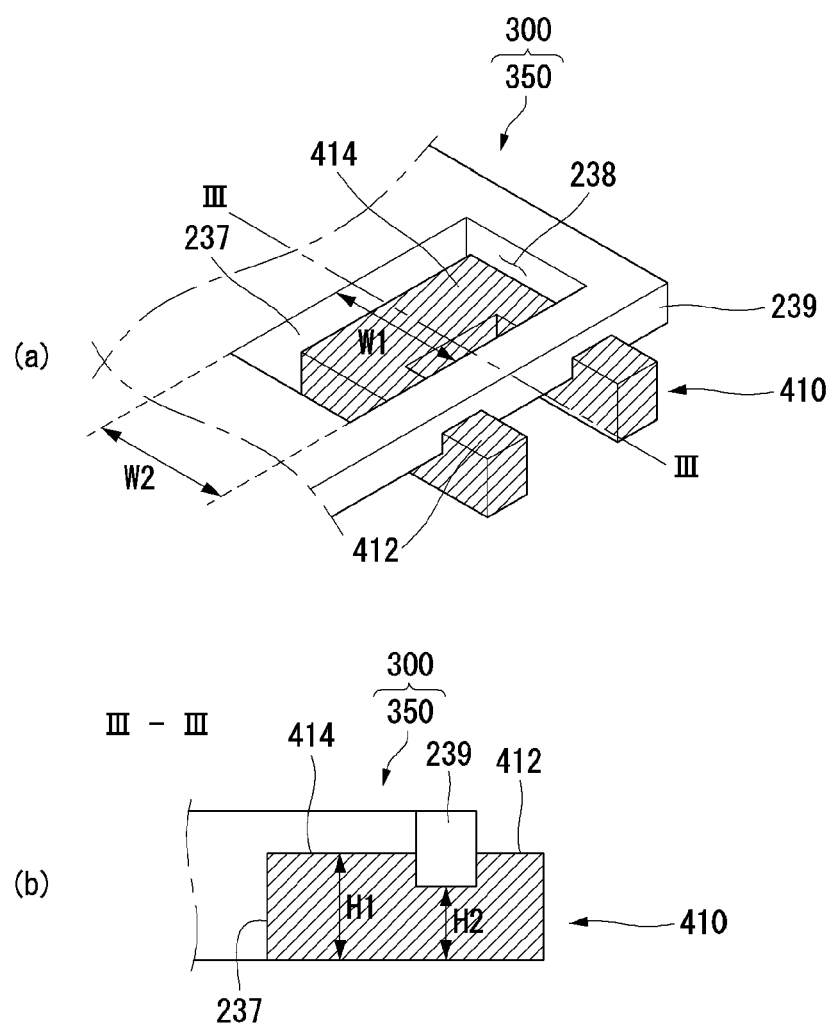

Referring to FIG. 13 (a), the fifth coupling portion 410 may be a mold separately formed from the module cover 130. The fifth coupling portion 410 may be formed through a separate injection process and attached to the module cover 130.

The eighth coupling portion 238 of the mold portion 300 may include a support bar 239. The support bar 239 may be pushed against the body portion 414 of the fifth coupling portion 410 to be coupled to the seating portion 412. The support bar 239 may be brought into close contact with the wall surface of the boundary between the body portion 414 and the seating portion 412. The width W1 of the central area of the eighth coupling portion 238 may be greater than the width W2 of the outer peripheral area of the eighth coupling portion 238.

Referring to FIG. 13 (b), the support bar 239 may be coupled with the seating portion 412 of the fifth coupling portion 410. The seating portion 412 of the fifth coupling portion 410 may be formed lower than the body portion 414 of the fifth coupling portion 410. For example, the height of the body portion 414 is H1, the height of the seating portion 412 may be H2 smaller than H1.

The support bar 239 may be coupled with the seating portion 412, while the support bar 239 is located higher than the lower surface of the contact portion 237. Due to such a positional relationship of the support bars 239, the support bar 239 can be more closely attached to the body portion 414 and the seating portion 412.

Figure 14:
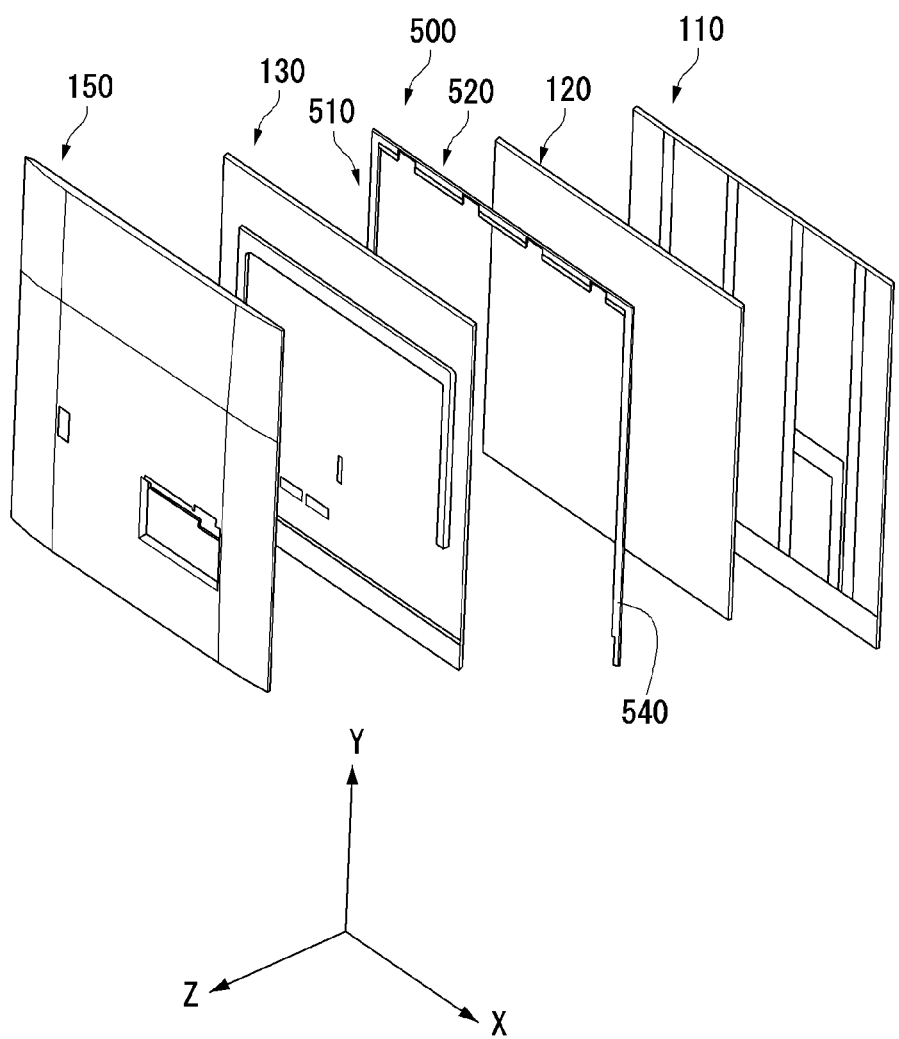
FIG. 14 is an exploded view of a display device according to another embodiment of the present invention.

FIG. 14 is an exploded view of a display device according to another embodiment of the present invention.

A display device 100 according to another embodiment of the present invention may include a display panel 110, a plate 120, a module cover 130, a rear cover 150, and a mold portion 500.

The mold portion 500 may be provided for sliding engagement (coupling) of the rear cover 150. The mold portion 500 may be integrally formed with at least one of the plate 120 and the module cover 130. The mold portion 500 may be extruded into at least one of the plate 120 and the module cover 130. The mold portion 500 may be made of a plastic material suitable for extrusion.

The mold portion 500 may include first to third molds 520, 510, and 540. The first to third molds 520, 510, and 540 may be formed together or may be separately formed and assembled.

FIGS. 15 to 24 are views showing the configuration of the display device of FIG. 14.

Figure 15:
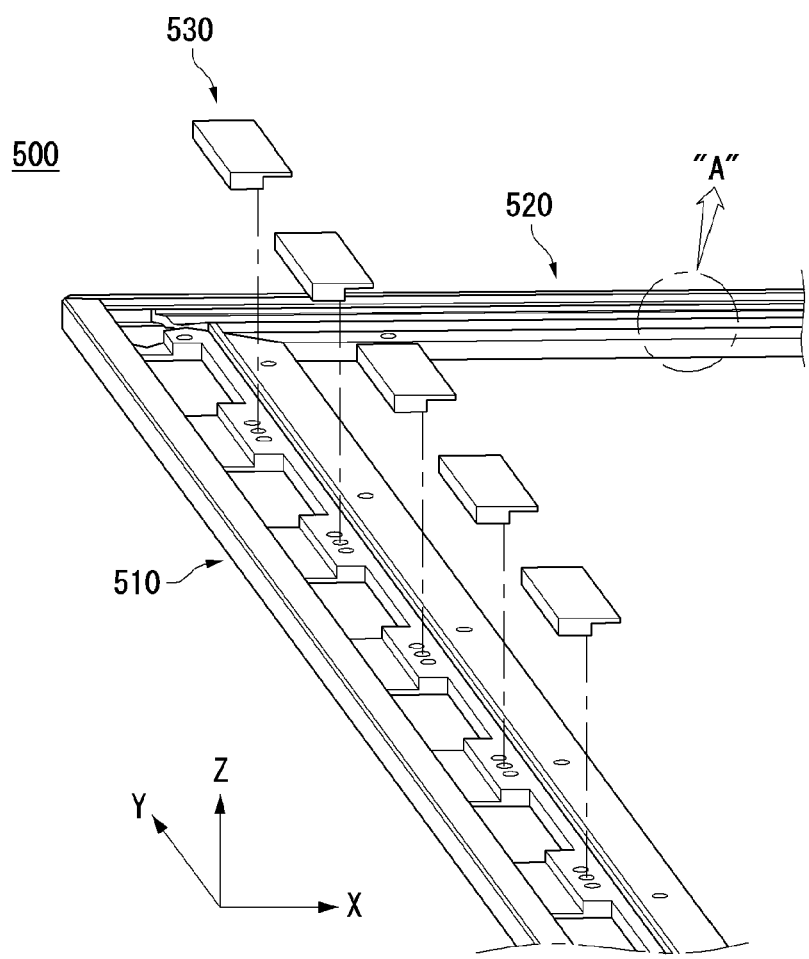
FIGS. 15 to 24 are views showing the configuration of the display device of FIG. 14.

Referring to FIG. 15, the second mold 510 may include a mold guide 530.

A plurality of mold guides 530 may be spaced apart at regular intervals along the Y direction of the second mold 510. For example, the mold guide 530 may be made separately from the second mold 510 and be attached onto the second mold 510.

Figure 16:
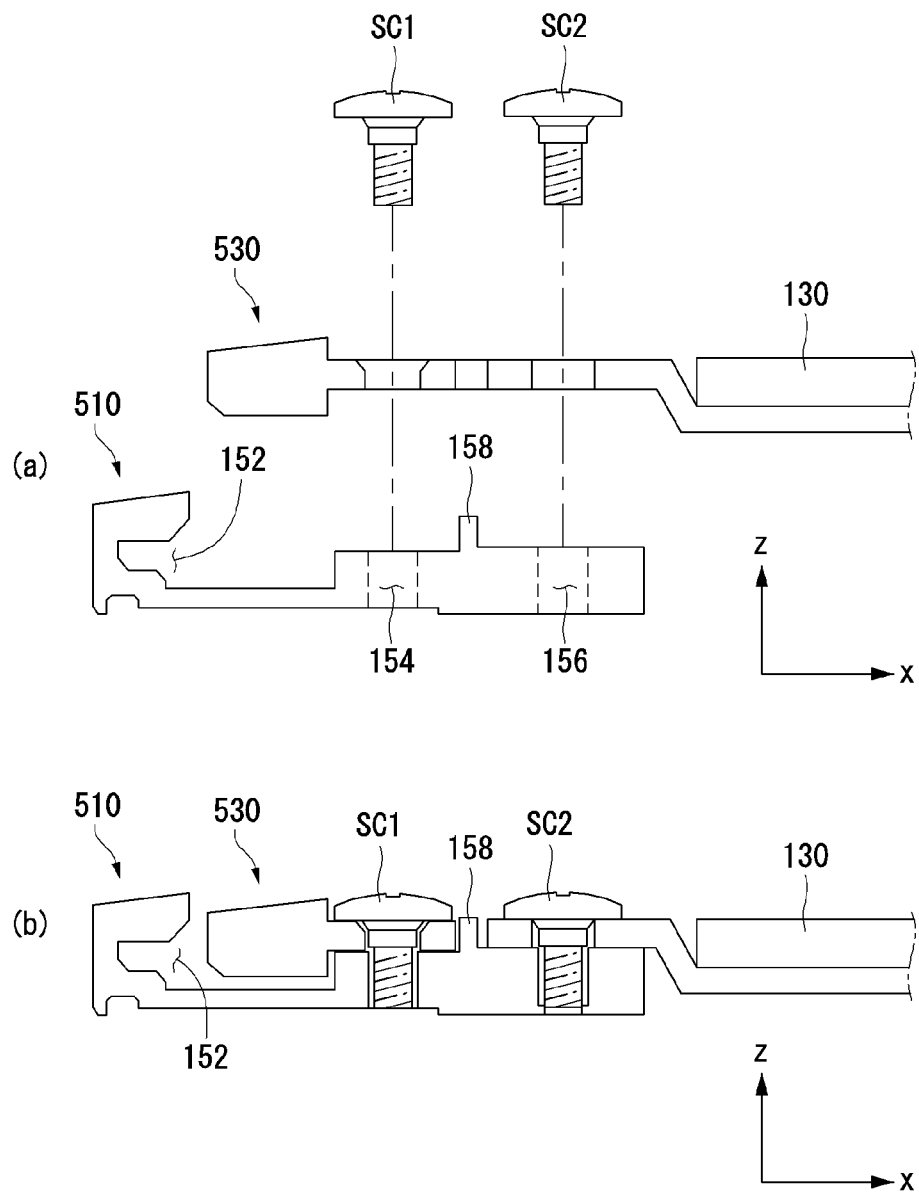

FIG. 16 is a cross-sectional view showing the coupling relationship between the second mold 510 and the mold guide 530.

The second mold 510 may have the engaging portion 152, the first and second fastening holes 154 and 156, and the rib 158.

The engaging portion 152 may be a recessed region formed in a part of the second mold 510. An edge region of the rear cover 150 slidingly coupled to the second mold 510 may be inserted into the engaging portion 152.

A first screw SC1 for coupling the mold guide 530 may be coupled with the first fastening hole 154.

A second screw SC2 for coupling the module cover 130 with the second mold 510 may be coupled into the second fastening hole 156. The mold portion 500 according to an embodiment of the present invention may serve to fix the module cover 130. In case that the module cover 130 and the plate 120 are integrally formed, the mold portion 500 may serve to fix the module cover 130 and the plate 120 at a time.

The rib 158 may be positioned between the first and second fastening holes 154 and 156. The rib 158 can serve as a guide in the process of coupling the mold guide 530 with the first coupling hole 154 and/or second coupling hole 156. For example, the module cover 130 may smoothly be seated in the engagement position.

Figure 17:
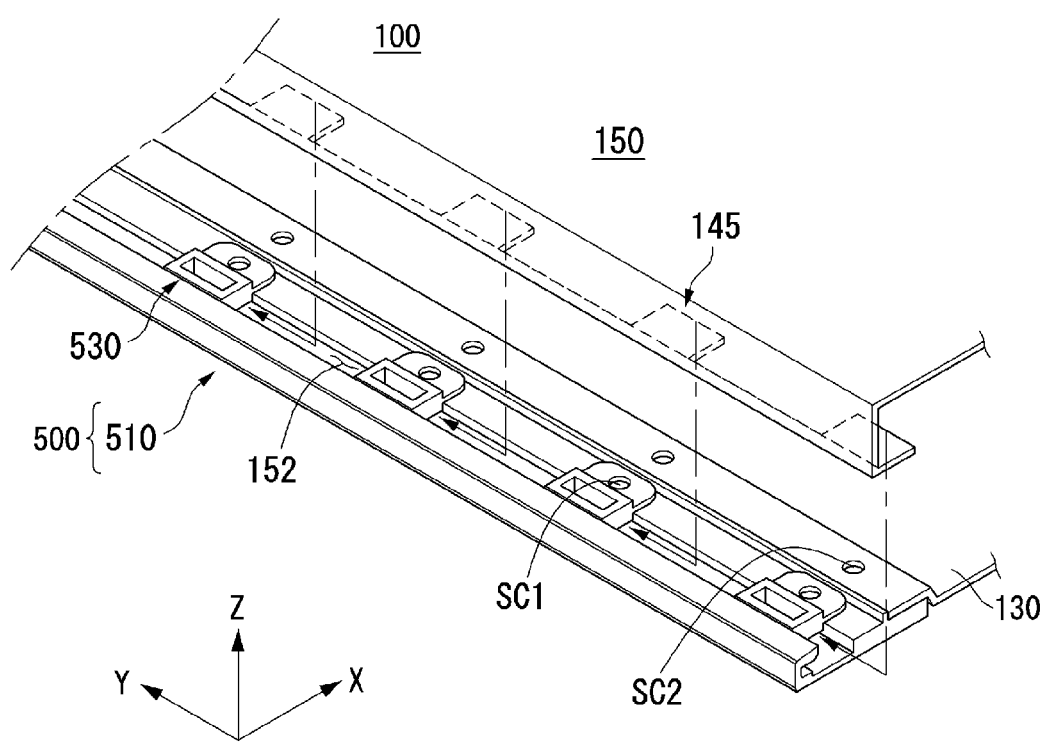

Referring to FIG. 17, the flange 145 of the rear cover 150 may be slidably coupled with the mold guide 530. For example, by moving the rear cover 150 in the Z direction and then moving the rear cover 150 in the Y direction, the flange 145 inside the rear cover 150 may be coupled inside the respective mold guides 530.

Figure 18:
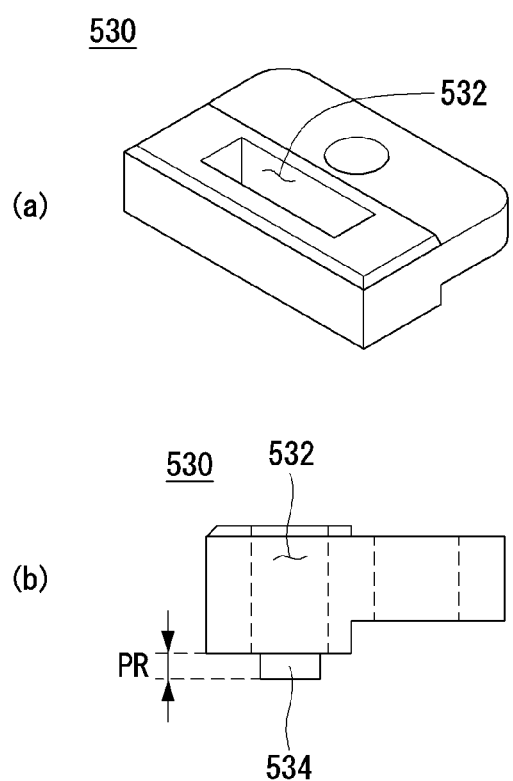

Referring to FIG. 18, the mold guide 530 may include a configuration for effective coupling with the rear cover 150.

Referring to FIG. 18 (a), the mold guide 530 may include a depressed portion 532. The depressed portion 532 may be shaped such that a part of the body of the mold guide 530 is pushed forward. The depressed portion 532 may be concave with respect to the rear cover 150. Inside the depressed portion 532, the contact portion 534 may be located.

Referring to FIG. 18 (b), the contact portion 534 may protrude forward as much as PR relative to the body of the mold guide 530. Since the contact portion 534 protrudes forward from the other portion of the mold guide 530, the contact portion 534 may be brought into close contact with the rear cover 150. Therefore, noise and/or vibration due to loose contact between the mold guide 530 and the rear cover 150 may be prevented.

Figure 19:
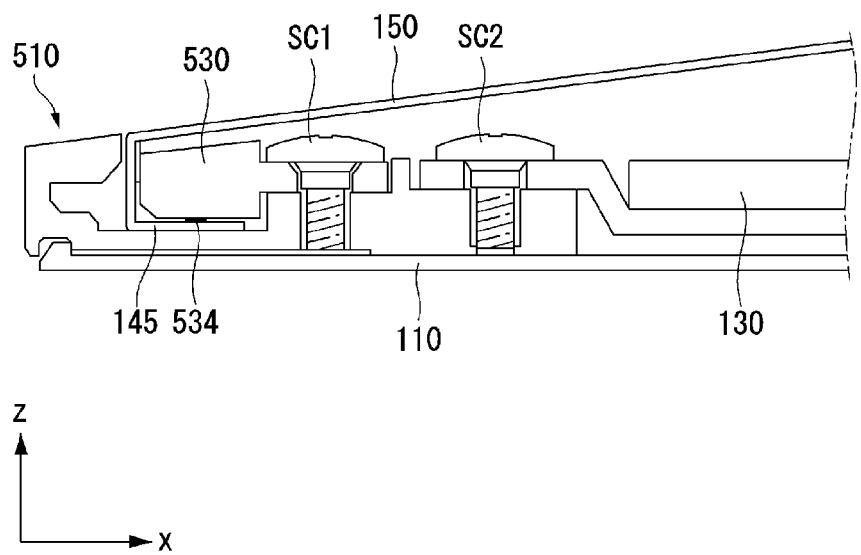

FIG. 19 is a cross-sectional view illustrating a state in which the rear cover 150 is coupled. The flange 145 bent inward of the rear cover 150 may be coupled between the mold guide 530 and the second mold 510. The contact portion 534 protruding from the mold guide 530 may press the flange 145. Therefore, the rear cover 150 may be firmly coupled and the rear cover 150 may be prevented from being shaken.

Figure 20:
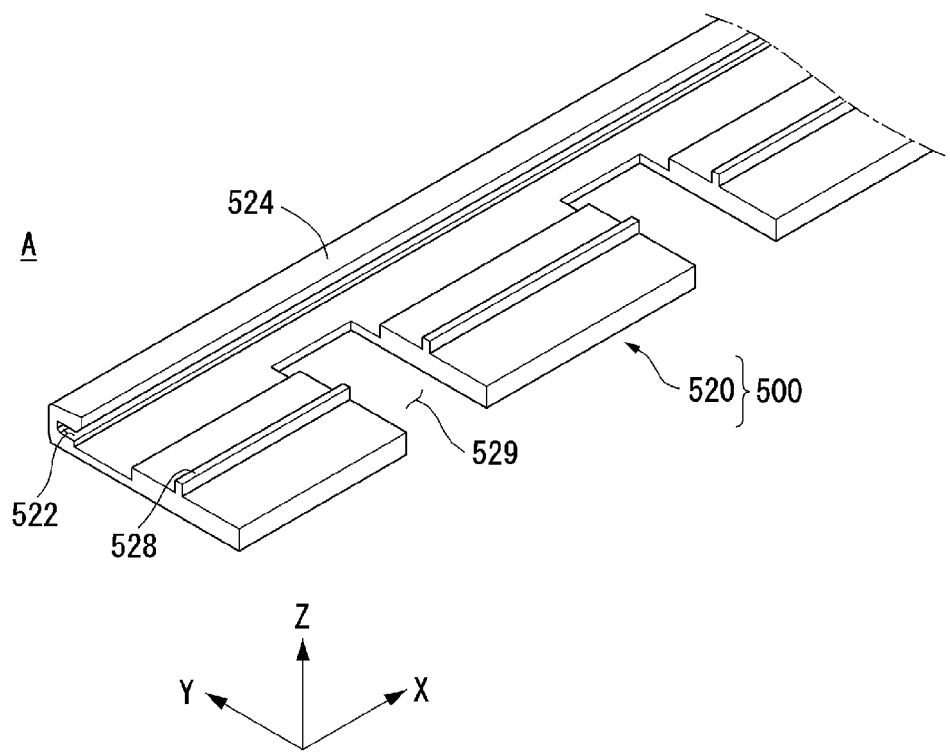

FIG. 20 is a view showing "A" of the FIG. 15. The first mold 520 may be provided with a cover insertion portion 522.

The cover insertion portion 522 may be a depression formed in an end region (524) of the first mold 520. For example, the cover insertion portion 522 may be open toward other elements such as a support rib 528 or a slit 529.

At least one support rib 528 may be formed in the first mold 520. The support ribs 528 may press the rear cover 150 coupled to the cover insertion portion 522 in the Z direction. Accordingly, it is possible to prevent the rear cover 150 from vibration and/or noise due to contact between the rear cover 150 and the first mold 520. In the first mold 520, slits 529 may be formed at regular intervals.

Figure 21:
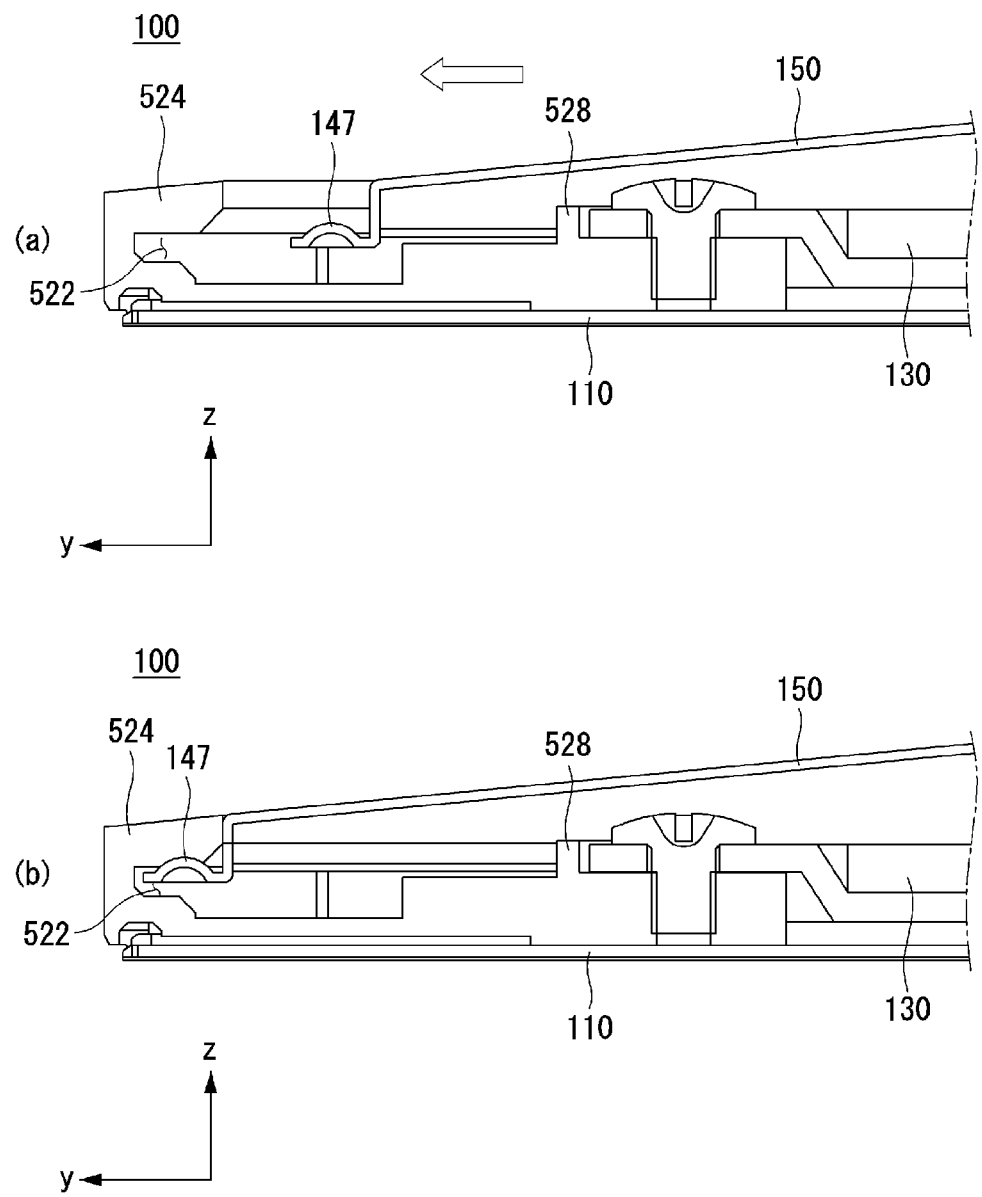

Referring to FIG. 21, the rear cover 150 may be slidably coupled with the first mold 520. For example, the rear cover 150 may slide and be coupled in the Y direction. When the rear cover 150 is slid, an eleventh coupling portion 147 formed at the upper end of the rear cover 150 may be inserted into the cover insertion portion 522.

Figure 22:
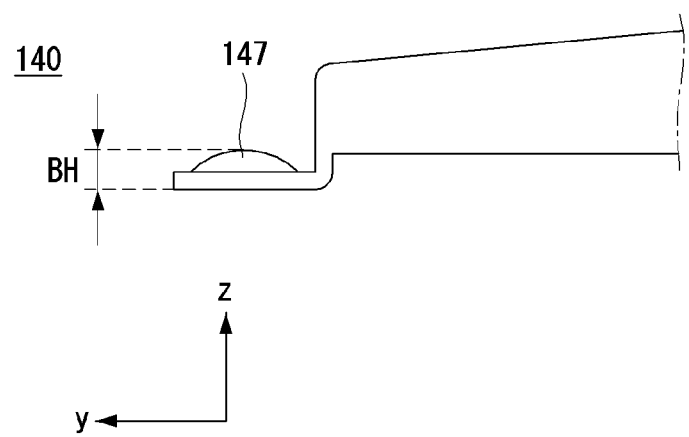

Referring to FIG. 22, the eleventh coupling portion 147 may be shaped to protrude in one direction. For example, the eleventh coupling portion 147 may protrude backward as much as a distance BH from the rear cover 150. The eleventh coupling portion 147 may be brought into close contact with the first mold 520 within the cover insertion portion 522 due to the eleventh coupling portion 147.

Figure 23:
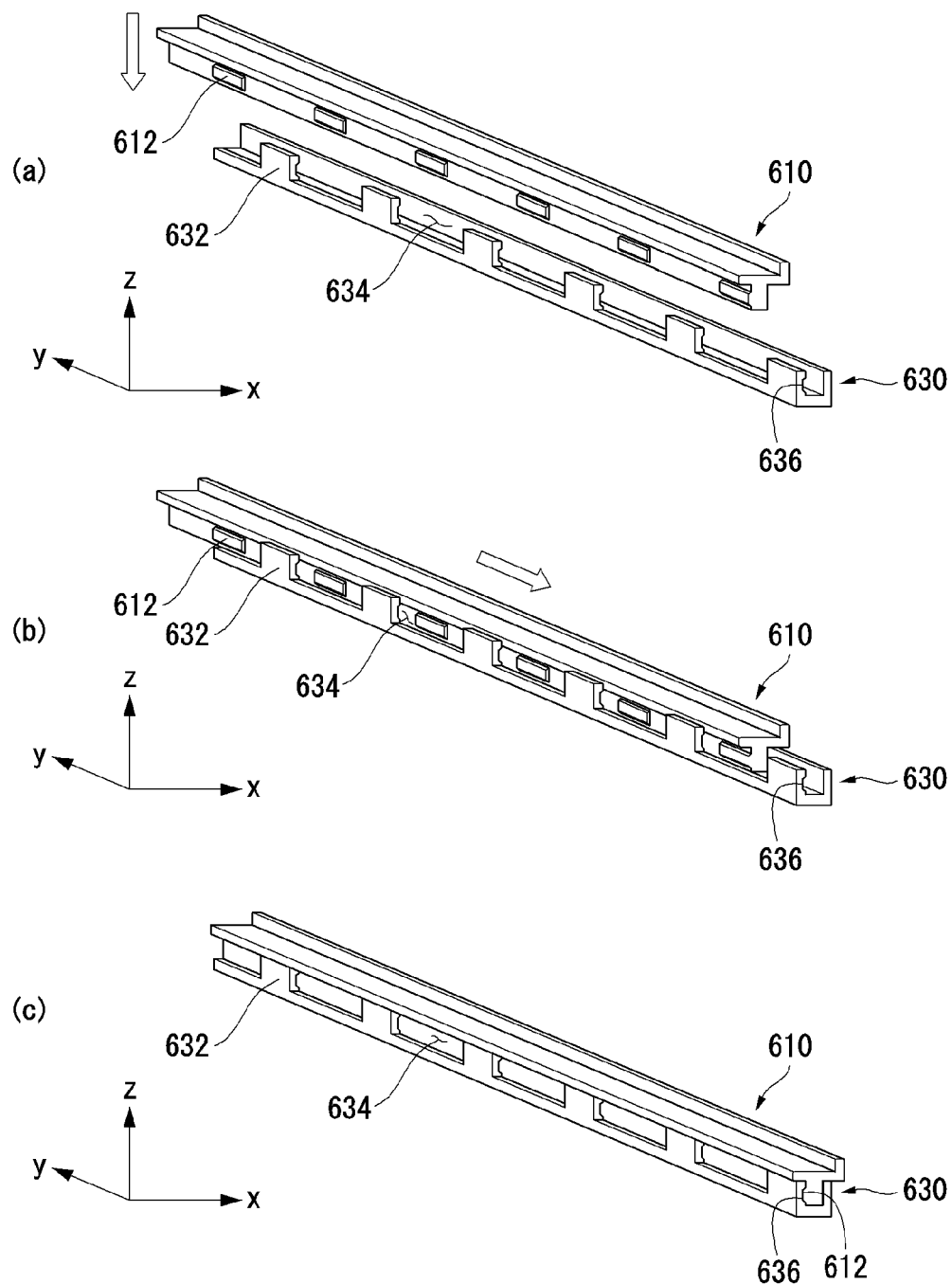

Referring to FIG. 23, the rear cover 150 may be slidingly coupled using a rail-shaped structure. For example, the first rail 610 may be coupled to the inner side of the rear cover 150 and the second rail 630 may be coupled to the module cover 130. Or the second rail 610 may be formed on the mold portion 500.

Referring to FIG. 23 (a), protrusions 612 may be formed on the first rails 610 at regular intervals. The size and spacing of the protrusions 612 may correspond to the spacing portion 634 formed on the side of the second rail 620. The spacing portion 634 may be a space between the neighboring sidewalls 632. The protrusion 612 may correspond to the groove 636 of the sidewall 632.

Referring to FIGS. 23 (b) and (c), the first rail 610 and the second rail 620 may be slid in the Y direction to be coupled. The protrusion 612 of the first rail 610 may be inserted into the sidewall 632 of the second rail 620 when the first rail 610 is slid.

Figure 24:
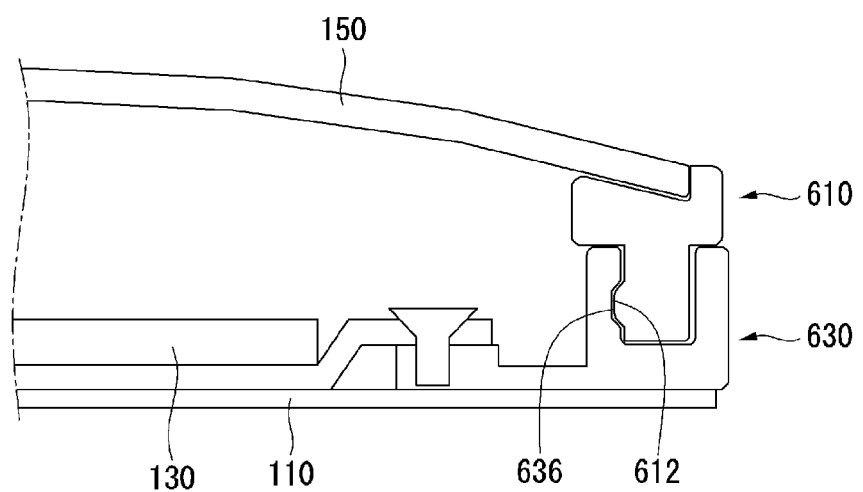

Referring to FIG. 24, when the protrusion 612 is inserted into the groove 636 on the side wall 632, the first rail 610 and the second rail 630 may be coupled with each other. The first rail 610 may be coupled with the rear cover 150. The second rail 630 may be coupled with the module cover 130. Accordingly, due to the coupling of the first and second rails 610 and 630, the rear cover 150 and the module cover 130 may be coupled to each other.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
   a display panel having a front surface displaying an image;
   a module cover positioned at a rear of the display panel and coupled with a rear surface of the display panel;
   a rear cover slidably coupled to the module cover, the rear cover positioned at a rear of the module cover;
   a mold portion coupled with one of the module cover and the rear cover; and
   a coupling portion coupled with another of the module cover and the rear cover, the coupling portion corresponding to the mold portion,
   wherein the mold portion is slidably coupled to the coupling portion
   wherein the coupling portion is located on at least one long edge of the module cover, and wherein the coupling portion includes an opening open in a sliding direction of the rear cover,
   wherein the coupling portion includes a first coupling portion positioned at a periphery of the module cover and a second coupling portion positioned further inward than the first coupling portion,
   wherein the mold portion includes a third coupling portion corresponding to the first coupling portion and a fourth coupling portion corresponding to the second coupling portion, and
   wherein the first to fourth coupling portions are elastically deformed when the first to fourth coupling portions are coupled.

2. The display device of claim 1, wherein the coupling portion is located on at least one short edge of the module cover, and wherein the coupling portion includes an opening open in a sliding direction of the rear cover.

3. The display device of claim 2, wherein the coupling portion includes:
   a sixth coupling portion positioned at a periphery of the module cover;
   a fifth coupling portion positioned inner than the sixth coupling portion; and
   a seventh coupling portion positioned inner than the sixth coupling portion.

4. The display device of claim 3,
   wherein the mold portion comprises:
   a eighth coupling portion corresponding to the fifth coupling portion;
   a ninth coupling portion corresponding to the sixth coupling portion; and
   a tenth coupling portion corresponding to the seventh coupling portion,
   wherein the fifth coupling portion is a mold, and wherein the eighth coupling portion is elastically deformed and contact with the fifth coupling portion.

5. The display device of claim 4, wherein the fifth coupling portion includes:
   a body portion; and
   a seating portion extended from the body portion,
   wherein the eighth coupling portion is seated at the seating portion of the fifth coupling portion, and wherein a height of the body portion is greater than a height of the seating portion.

6. The display device of claim 1, further comprising a plate positioned between the display panel and the module cover, wherein the plate is coupled with at least one of the display panel and the module cover.

7. The display device of claim 1, wherein the display panel is an OLED (organic light emitting diodes) type.

8. The display device of claim 1, wherein the mold portion comprises:
   a first mold corresponding to a long edge of the module cover;
   second and third molds corresponding to short edges of the module cover; and
   a plurality of mold guides positioned on at least one of the second mold and the third mold,
   wherein the plurality of mold guides are placed spaced apart from each other along a direction of slidably coupling of the rear cover.

9. The display device of claim 8, wherein each of the mold guide includes a contact portion projecting toward the rear cover.

10. The display device of claim 9, wherein the contact portion is elastically deformed and press the rear cover, when the rear cover is coupled.

11. The display device of claim 1, wherein the mold portion comprises:
    a first mold corresponding to a long edge of the module cover; and
    second and third molds corresponding to short edges of the module cover,
    and wherein the first mold includes a depressed portion formed along a lengthwise direction of the first mold.

12. The display device of claim 1, further comprising a plate positioned between the display panel and the module cover, wherein the plate is coupled with at least one of the display panel and the module cover, and wherein the mold portion is coupled with a periphery of the module cover and a periphery of the plate.

13. The display device of claim 1, wherein a deformation of the third and fourth coupling portions is greater than a deformation of the first and second coupling portions.

* * * * *